(12) United States Patent  
Sinitsky et al.

(10) Patent No.: US 8,704,605 B1
(45) Date of Patent: Apr. 22, 2014

(54) CLASS-AB XTAL CIRCUIT (75) Inventors: Dennis Sinitsky, Sunnyvale, CA (US);
Junshi Qiao, Shanghai (CN); Shafiq M. Jamal, Pleasanton, CA (US); Tao Shui, Cupertino, CA (US)

(73) Assignee: Marvell International Ltd. (BM)

( * ) Notice: Subject to any disclaimer, the term of this patent is extended or adjusted under 35 U.S.C. 154(b) by 154 days.

(21) Appl. No.: 13/353,852

(22) Filed: Jan. 19, 2012

Related U.S. Application Data (60) Provisional application No. 61/434,287, filed on Jan. 19, 2011.

(51) Int. Cl.
H03B 5/36 (2006.01)

(52) U.S. Cl.
USPC .................. 331/158; 331/116 FE; 331/116 R (58) Field of Classification Search
USPC .................................. 331/158, 116 R, 116 FE
See application file for complete search history.

(56) References Cited

U.S. PATENT DOCUMENTS

| | | | |
|---|---|---|---|
| 4,091,339 A | 5/1978 | Sugimoto et al. | |
| 6,590,460 B1 | 7/2003 | Tenten et al. | |
| 6,798,301 B1 | 9/2004 | Balan et al. | |
| 6,819,196 B2 | 11/2004 | Lovelace et al. | |
| 7,061,338 B2 | 6/2006 | Arigliano | |
| 7,292,114 B2 | 11/2007 | Greenberg | |
| 7,639,097 B2 * | 12/2009 | Tran .............................. | 331/158 |
| 7,839,228 B2 | 11/2010 | Greenberg | |
| 2003/0001685 A1 | 1/2003 | Groe et al. | |

FOREIGN PATENT DOCUMENTS

| | | |
|---|---|---|
| EP | 0 140 343 | 10/1984 |
| JP | 54-151358 | 11/1979 |
| JP | 59-114908 | 7/1984 |
| JP | 07-297641 | 11/1995 |
| JP | 10-325886 | 12/1998 |
| JP | 2000-183652 | 6/2000 |
| WO | WO 2005-008881 A1 | 1/2005 |

OTHER PUBLICATIONS

State Intellectual Property Office of the People's Republic of China, Text of the Second Office Action; Application No. 200610099599.4 dated Jun. 29, 2010, 2 pgs.
State Intellectual Property Office of the People's Republic of China, Text of the First Office Action; Application No. 200610099599.4 dated Apr. 10, 2009, 6 pgs.
Translation of Japanese Office Action for Japanese Patent Application No. 2006-208095 dated Mar. 3, 2009, 3 pgs.
Translation of Japanese Office Action for Japanese Patent Application No. 2006-208095 dated Aug. 19, 2008, 4 pgs.
Singapore Examination Report for Singapore Patent Application No. 200605079-3, date of mailing Jun. 6, 2008, 4 pgs.
Vittoz et al., "High-Performance Crystal Oscillator Circuits: Theory and Application", IEEE Journal of Solid-State Circuits, vol. 23, No. 3, Jun. 1988 pp. 774-783.

* cited by examiner

Primary Examiner — Arnold Kinkead (57) ABSTRACT

A resonant element driver circuit includes a NMOS transistor and a PMOS transistor that are configured to drive a resonant element. The resonant element driver circuit includes biasing circuitry that is configured to bias the PMOS transistor. The biasing circuitry receives a reference signal that is used to set the biasing on the PMOS transistor. The resonant element driver further includes mirror circuitry that tracks current flowing through the NMOS and PMOS transistors.

13 Claims, 4 Drawing Sheets

CLASS-AB XTAL CIRCUIT

RELATED APPLICATION

This application claims the benefit of U.S. Provisional Application No. 61/434,287, filed Jan. 19, 2011, which is incorporated herein by reference in its entirety.

BACKGROUND

Crystal oscillators include a resonant element, such as a quartz crystal, that generates an oscillating signal. Crystal oscillators are used in various electronic applications. For example, crystal oscillators are often used to generate clock signals that time data transfers between integrated circuits. Crystal oscillators are found in many consumer devices, such as clocks, radios, computers, and mobile phones.

BRIEF SUMMARY

The present disclosure describes a resonant element driver circuit that includes a pair of transistors configured to drive a resonant element, including a first transistor and a second transistor. The resonant element driver circuit also includes first biasing circuitry configured to bias the first transistor and second biasing circuitry configured to bias the second transistor. The second biasing circuitry is configured to receive a reference signal independent of a voltage source and to use the reference signal in order to bias the second transistor.

The present disclosure also describes a method that includes biasing, with biasing circuitry, a first transistor of a resonant element driver circuit with a first reference signal. The method also includes biasing, with the biasing circuitry, a second transistor of the resonant element driver circuit with a second reference signal. The second reference signal is independent of a voltage source. The method further includes driving the resonant element with the first transistor and the second transistor.

In addition, the present disclosure describes a resonator that includes a resonant element; and a resonant element driver circuit coupled to the resonant element. The resonant element driver circuit has a pair of transistors configured to drive the resonant element, including a first transistor and a second transistor. The resonant element driver circuit also has first biasing circuitry configured to bias the first transistor; and second biasing circuitry configured to bias the second transistor. The second biasing circuitry is configured to receive a reference signal independent of a voltage source. The second biasing circuitry is also configured to use the reference signal in order to set the biasing on the second transistor.

DETAILED DESCRIPTION

The present disclosure describes various embodiments of a resonant element driver circuit that is configured to drive a resonant element such as a crystal. The resonant element driver includes a pair of transistors that are configured to drive the resonant element. The pair of transistors provides an increased transconductance to the resonant element driver circuit as compared to driver circuits that use only a single transistor. Less current is needed to drive the resonant element due to the increased transconductance. The resonant element driver circuit further includes bias circuitry that is configured to bias one of the transistors. The bias circuitry is configured to receive a reference signal that is selectable, adjustable, and/or controllable to set the biasing on the transistor. The reference signal may be independent of a voltage supplied by a voltage supply. The resonant element driver circuit may also include mirror circuitry that is configured to track variations in bias current used to drive the resonant element. Transistors in the bias and/or mirror circuitry may be sized smaller than the transistors used to drive the resonant element so that current consumption in the bias and/or mirror circuitry is reduced or minimal.

Figure 1:
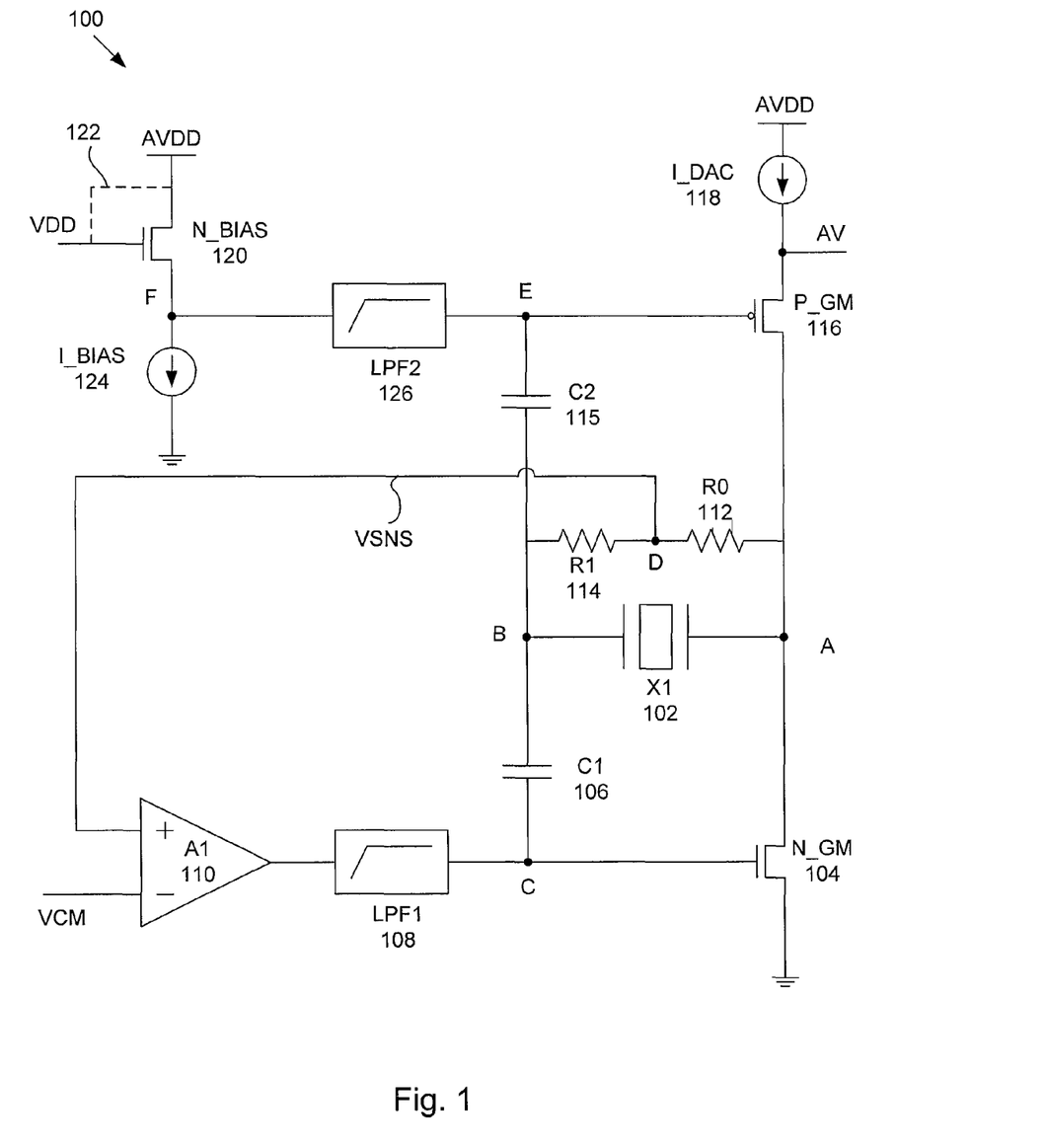
FIG. 1 is a schematic block diagram of one embodiment of a resonator driver.

FIG. 1 is a schematic of an example resonant element driver circuit 100 that is configured to drive and/or cause to oscillate a resonant element X1 102. The resonant element X1 102 is configured to resonate at one or more frequencies in response to current and/or voltage provided to the resonant element X1 102. The resonant element X1 102 may be a quartz crystal resonator, although other types of resonant elements may be used. In one example, the resonant element X1 102 is off-chip from the components of the resonant element driver circuit 100. Alternatively, the resonant element X1 102 is on chip. A resonator, such as a crystal oscillator, includes the resonant element X1 102 coupled to the resonant element driver circuit 100.

The resonant element driver circuit 100 includes a first transistor N_GM 104 coupled to the resonant element X1 102. The first transistor N_GM 104 is a n-channel metal-oxide semiconductor (NMOS) transistor. The transistor N_GM 104 has a drain connected to the resonant element X1 102 at a first terminal (or electrode) of the resonant element X1 102, indicated by node A in FIG. 1. The transistor N_GM 104 also has a gate that is capacitively coupled to a second terminal (or electrode) of the resonant element, indicated by node B in FIG. 1, via a capacitor C1 106. The capacitance of the capacitor C1 106 is larger than a gate-to-source parasitic capacitance of the transistor N_GM 104 so that an alternating current (AC) signal at the gate of the transistor N_GM 104, indicated by node C, has an amplitude that is smaller than an amplitude of an AC signal at the second terminal at node B. In addition, a source of the transistor N_GM 104 is connected to ground.

The resonant element driver circuit 100 further includes a filter LPF1 108 that has a first end that is connected to the gate of the transistor N_GM 104 at node C and a second end that is connected to an output of an amplifier A1 110. The filter LPF1 108 is a low pass filter that is configured to filter signals at node C so that the signals are direct current (DC) or substantially DC signals at the output of the amplifier A1 110. The filter LPF1 108 may include a resistor-capacitor (RC) configuration, such as a resistor connected in shunt with a capacitor. Other low-pass filter configurations may be used.

The amplifier A1 110 is an operational amplifier (op-amp) that is configured to output a signal that sets a direct current (DC) bias voltage on the gate of the transistor N_GM 104. The amplifier A1 110 is configured to receive a predetermined reference signal VCM at a negative terminal of the amplifier A1. In one example, the reference signal has a DC common mode voltage. An example common mode voltage may be 0.6 volts, although other voltages may be used. The amplifier A1

110 is also configured to receive a signal VSNS from a node D that is in between node A and node B. The amplifier A1 110 is configured to receive the signal VSNS at a positive terminal of the amplifier A1 110. The amplifier A1 110 is further configured to compare the signal VSNS received from node D with the predetermined reference signal VCM and output the output signal based on the comparison.

The signal VSNS at node D may have a DC component that is a common mode point and/or an average point or midpoint between the DC component of the signal at node A and the DC component of the signal at node B. The DC component of the signal VSNS is determined by a resistive divider that has a first end connected to node A and a second end connected to node B. The resistor divider is used to sense the common mode between node A and node B. In one example, the common mode is 0.6 V, although the resonant element driver circuit 100 may be configured for other common mode voltages. The resistive divider includes a first resistor R0 112 and a second resistor R1 114. The first resistor R0 is connected to node A and node D. The second resistor R1 is connected to node D and node B. A resistance of the first resistor R0 112 may be equal to a resistance of the second resistor R1 114. Where the resistances of the first resistor R0 112 and the second resistor R1 114 are equal, the voltage VSNS is the average or midpoint of the voltage at node A and the voltage at node B. Where the DC component of the signal at node A and the DC component of the signal at node B are equal, the DC component of the signal at node D is the same as the DC component of the signals at nodes A and B. The DC component of the signal VSNS is also determined by a feedback loop that includes the amplifier A1 110, the filter LPF1 108, and the transistor N_GM 104. Additionally, AC components of signals at node B are 180 degrees out of phase with AC components of signals at node A. Also, when a signal level of a signal at node A increases, a signal level of a signal at node B decreases.

The resonant element X1 102 is driven by the transistor N_GM 104. In particular, the transistor N_GM 104 provides the drive current for the resonant element X1 102. The current that is provided may be determined by a transconductance associated with the transistor N_GM 104. The transconductance is proportional to a change in current over a change in voltage. The larger the transconductance, the more current that is drawn for a given bias voltage. The transconductance is also proportional to the current drawn over a fundamental constant of the transistor N_GM 104, including the thermal voltage of the transistor N_GM 104. The resonant element X1 102 is configured to oscillate when the transconductance reaches a threshold or a critical condition. Because the fundamental constant is an inherent and unchangeable property of the transistor N_GM 104, to increase the transconductance to the threshold or critical condition, the current is increased.

Alternatively or in addition, to increase the transconductance, another transistor is added to the resonant element driver circuit 100 to drive the resonant element X1 102. As shown in FIG. 1, a second transistor P_GM 116 is connected to the transistor N_GM 104 and to the resonant element X1 102. The transistor P_GM 116 is a p-channel MOS (PMOS) transistor having a drain that is connected to the drain of the transistor 104 and the first terminal (or electrode) of the resonant element X1 102 at node A. The transistor P_GM 116 also has a gate that is capacitively coupled to the second terminal (or electrode) of the resonant element X1 102 at node B via a capacitor C2 115. Adding the transistor P_GM 116 to the transistor N_GM 104 effectively increases or doubles the transconductance for the resonant element driver circuit 100 provided that the transistor N_GM 104 and the transistor P_GM 116 are matched in terms of their size and biasing. By increasing the transconductance, the amount of current needed to meet the threshold or critical condition of the transconductance is reduced. That is, by adding the transistor P_GM 116, less current is required for the resonant element X1 102 to oscillate at a predetermined and/or desired amplitude than if only the transistor N_GM 104 is used to drive the resonant element X1 102.

The transistor P_GM 116 and the transistor N_GM 104 may receive current supplied from a current source I_DAC 118. The current supplied by the current source I_DAC 118 is an analog current. In one example, the current supplied from I_DAC 118 is current converted from a digital signal by a digital-to-analog converter (DAC). The current source I_DAC 118 is connected to a source of the transistor P_GM 116. The current source I_DAC 118 may further be connected to a voltage source AVDD that drives the current source I_DAC 118. The voltage source AVDD provides a source voltage for the resonant element driver circuit 100. The source voltage may be a fixed voltage. For example, the voltage is not adjustable during operation of the resonant element driver circuit 100. In some examples, the source voltage is 1.2 V or 1.8 V, although other voltages may be used.

The resonant element driver circuit 100 further includes biasing circuitry that is configured to bias the transistor P_GM 116, including the source of the transistor P_GM 116, which is identified by node AV in FIG. 1. The biasing circuitry may be configured to set the voltages at the terminals of the transistor P_GM 116, including the gate, identified by node E in FIG. 1 and the source at node AV. Through the biasing circuitry, the biasing set on the transistor P_GM 116 is controllable, adjustable, selectable, and/or dynamic. Additionally, the biasing for the transistor P_GM 116 may be set independent of the voltage source AVDD. Alternatively, without the biasing circuitry, the biasing for the transistor P_GM 116, and thus the current flowing through the transistor P_GM 116, may depend on the voltage source AVDD. The voltage source AVDD may set the biasing of the transistor P_GM 116 at levels that are greater than necessary to drive the resonant element X1 102, resulting in excess power consumption. Additionally, source voltages, such as the voltage source AVDD, generally provide fixed voltages to the circuit. Thus, where the biasing for the transistor P_GM 116 is set by the voltage source AVDD, the current flowing through the transistor P_GM 116 used to drive the resonant element X1 102 is not selectable, adjustable, or controllable, and is instead fixedly determined by the voltage source AVDD. In turn, the amplitude of the oscillating signal generated by the resonant element X1 102 is not selectable, adjustable, or controllable. By adding the biasing circuitry, the transistor P_GM 116 is selectable, controllably, or adjustably biased so that the amplitude of oscillation of the signal generated by the resonant element X1 102 is controlled.

In the example resonant element driver circuit 100 shown in FIG. 1, the biasing circuitry includes a transistor N_BIAS 120. The transistor N_BIAS 120 is a NMOS transistor. The transistor N_BIAS 120 may be a long-channel transistor. A drain of the transistor N_BIAS 120 is connected to the voltage source AVDD. A gate of the transistor N_BIAS 120 is provided with a voltage VDD, which may be indicative of a voltage in a digital power domain. The voltage VDD may be 1.1 V, although other voltages may be used. In one example, the gate and the drain of the transistor N_BIAS 120 are unconnected. In an alternative example, the gate and the source of the transistor N_BIAS 120 are connected, as indicated by the dotted connection 122, and the voltage VDD applied to the gate is equal to the voltage source AVDD applied to the drain. A source of the transistor N_BIAS 120, identified by node F in FIG. 1, is connected to a current source I_BIAS 124 connected to ground. The current drawn by the current source I_BIAS 124 is indicative of the drain-to-source bias current $I_{DS}$ drawn by the transistor N_BIAS 120. The voltage VDD applied to the gate of the transistor N_BIAS 120 sets the source voltage at node F. The source of the transistor N_BIAS 120 is coupled to the gate of the transistor P_GM 116 via a filter LPF 2 126. The voltage at the source of the transistor N_BIAS 120 sets the bias voltage of the gate of the transistor P_GM 116 at node E, which in turn, sets the source voltage of the transistor P_GM 116 at node AV. The voltage at node AV can be determined as follows:

$$V_{AV} = VDD - V_{gs\_N\_BIAS} + V_{gs\_M2}, \quad (1)$$

where $V_{AV}$ is the voltage at the source of the transistor P_GM 116 at node AV, VDD is the voltage applied to the gate of the transistor N_BIAS 120, $V_{gs\_N\_BIAS}$ is the gate-to-source voltage of the transistor N_BIAS 120, and $V_{gs\_P\_GM}$ is the gate-to-source voltage of the transistor P_GM 116. As such, the voltage VDD applied to the gate may be used to set the gate and source voltages of the transistor P_GM 116.

As previously mentioned, the gate of the transistor P_GM 116 is capacitively coupled to the second terminal of the resonant element X1 102 at node B via the capacitor C2. By being capacitively coupled, an AC signal at node B is replicated at the gate of the transistor P_GM at node E. The filter LPF2 126 is a low pass filter and is connected in between the gate of the transistor P_GM 116 at node E and the source of the transistor N_BIAS 120 at node F. The AC signal at node E is filtered to be a DC signal or a substantially DC signal at node F. The low pass configuration of the filter LPF2 126 may include a resistor connected to a capacitor in shunt. Other low-pass filter configurations may be used.

In the example resonant element driver circuit 100 shown in FIG. 1, the gate-to-source voltage of the transistor P_GM 116 is highly dependent on the current supplied from the current source I_DAC 118. As indicated by equation (1) above, the source voltage of the transistor P_GM 116 at node AV is dependent upon the gate-to-source voltage of the transistor P_GM 116, and is thus dependent upon the current supplied from the current source I_DAC 118. It may be desirable to reduce and/or minimize the impact or effect that the current source I_DAC has on the gate-to-source voltage of the transistor P_GM 116, particularly where the current from the current source I_DAC varies.

Figure 2:
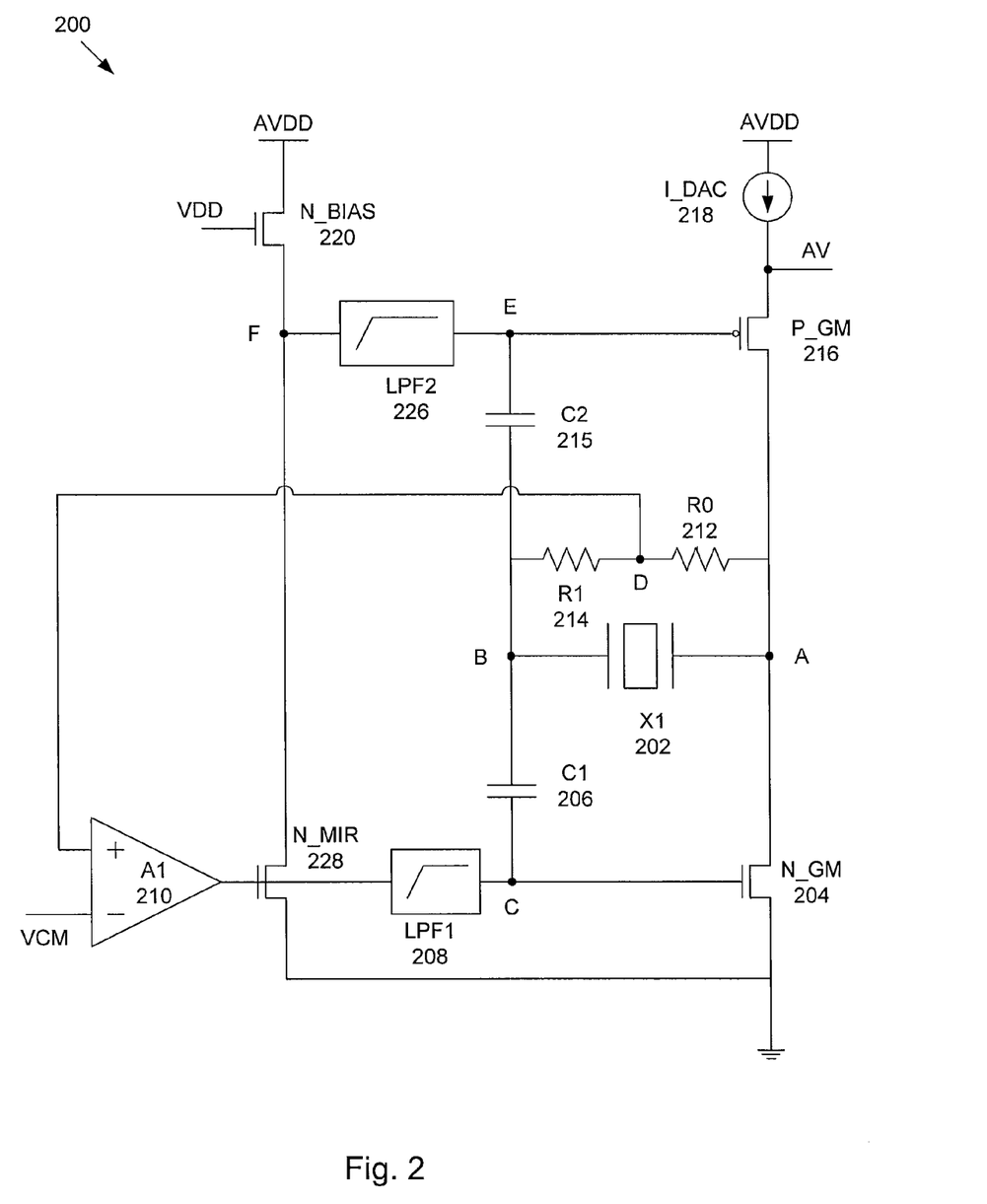
FIG. 2 is a schematic block diagram of a second embodiment of a resonator driver.

FIG. 2 shows an alternative example resonant element driver circuit 200 that is configured to drive a resonant element X1 202. The resonant element driver circuit 200 is similar to the resonant element driver circuit 100 shown in FIG. 1, except that the resonant element driver circuit 200 further includes mirror circuitry that tracks the current flowing through the PMOS and NMOS transistors. In FIG. 2, the resonant element driver circuit 200 includes a NMOS transistor N_BIAS 220 that is configured to bias a PMOS transistor P_GM 216, as previously described. A source of the transistor N_BIAS 220 is connected to a drain of a mirror transistor N_MIR 228. A gate of the mirror transistor N_MIR 228 is connected to an output of an amplifier A1 210 and an end of a low pass filter LPF1 208. Also, a source of the mirror transistor N_MIR 228 is connected to a source of a NMOS transistor N_GM 204, which is connected to ground.

By including the mirror transistor N_MIR 228 in the resonant element driver circuit 200, current flowing through the transistor P_GM 216 and the transistor N_GM 204 is tracked by the current flowing through the mirror transistor N_MIR 228 and the transistor N_BIAS 220. In turn, changes in the gate-to-source voltage of the transistor P_GM 216 due to variations in the current from the current source I_DAC 218 are tracked by the gate-to-source voltage of the transistor N_BIAS 220. As indicated above by equation (1), the source voltage of the transistor P_GM 216 is based on the voltage VDD applied to the gate of the transistor N_BIAS 220, the gate-to-source voltage of the transistor N_BIAS 220, and the gate-to-source voltage of the transistor P_GM 216. Because changes to the gate-to-source voltage of the transistor P_GM 216 are tracked by the gate-to-source voltage of the transistor N_BIAS 220, the voltage VDD applied to the gate of the transistor N_BIAS 220 can set, adjust, and/or control the source voltage at node AV of the transistor P_GM 216 more precisely than the voltage VDD applied to the gate of the transistor N_BIAS 120 of the resonant element driver circuit 100 shown in FIG. 1.

In one example, a size or dimension of the mirror transistor N_MIR 228 is much smaller than a size of the transistor N_GM 204. For example, a gate width of the transistor N_GM 204 may be more than an order of magnitude less, such as one one-hundredth the size of the mirror transistor N_MIR 228. Also, the transistor N_GM 204 and the mirror transistor N_MIR 228 may be sized so that their current densities match. That is, the gate width of the transistor N_MIR 228 is much smaller than the gate width of the transistor N_GM 204, but the gate lengths of the transistor N_MIR 228 and the transistor P_GM 204 match. As a result, the mirror transistor N_MIR 228 tracks variations in the current flowing through the transistor N_GM 204 and the transistor P_GM 216 while drawing much less current. By setting the size of the mirror transistor N_MIR 228 to be much smaller than the size of the transistor N_GM 204, current tracking may be performed while minimizing power consumption.

In addition or alternatively to having mirror circuitry that tracks variations in the gate-to-source voltage of the transistor P_GM, it may be desirable to set a reference signal that cancels the gate-to-source voltage of the transistor P_GM, such as by having the gate-to-source voltage of the transistor N_BIAS match or equal the gate-to-source voltage of the PMOS transistor P_GM. As indicated by equation (1) above, if the gate-to-source voltage of the transistor N_BIAS equals the gate-to-source voltage of the PMOS transistor P_GM then the gate-to-source voltages cancel and the voltage at the source of the PMOS transistor P_GM at node AV is equal to the voltage VDD applied to the gate of the transistor N_BIAS.

Figure 3:
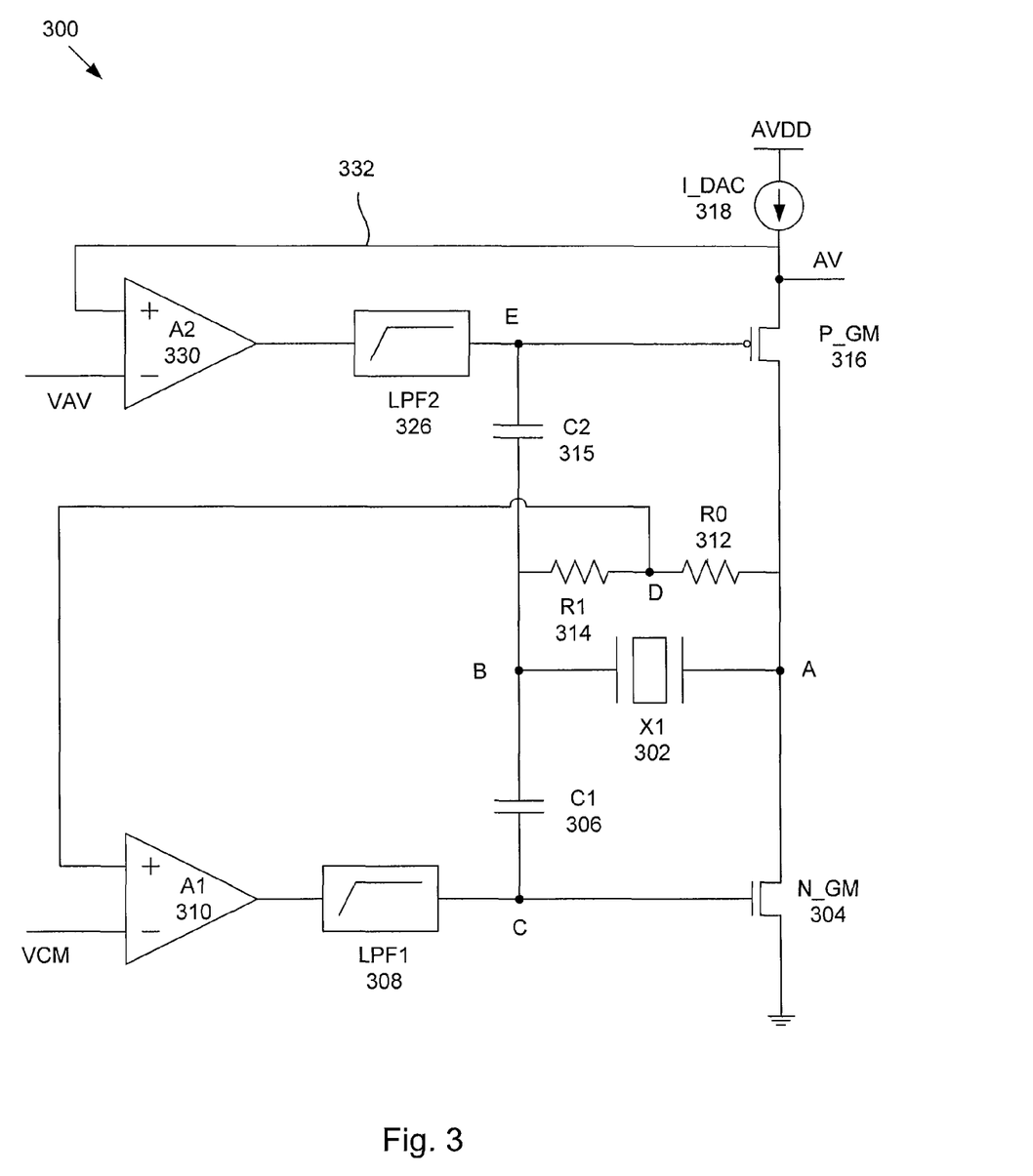
FIG. 3 is a schematic block diagram of a third embodiment of a resonator driver.

FIG. 3 shows a second alternative example resonant element driver circuit 300 that is configured to drive a resonant element X1 302. The resonant element driver circuit 300 is similar to the resonant element driver circuit 100, except that the transistor N_BIAS 120 and current source I_BIAS 124 of the bias circuitry are replaced with an amplifier A2 330 in communication with a feedback loop 332. The bias circuitry in the resonant element driver circuit 300 is configured so that the source voltage of a PMOS transistor P_GM 316 at node AV is equal to a reference signal, such as a reference voltage, VAV input to the amplifier A2. The amplifier A2 330 is an op-amp. In one example, the amplifier A2 330 has low current requirements because the predominant current in the resonant element driver circuit 300 is the current supplied by the current source I_DAC 318. The amplifier A2 330 is configured to receive the reference signal VAV at an input, such as a negative input, of the amplifier A2 330. In addition, the amplifier A2 is configured to receive at another input, such as a positive input, signal VAV_FB that is indicative of the source voltage of the transistor P_GM 316 at node AV. The amplifier A2 330 is configured to compare the signal VAV_FB with the reference signal VAV and output an output signal having a DC component that sets the source voltage of the transistor P_GM 316 to be equal to a voltage of the reference signal VAV. The amplifier A2 330 is configured to receive the signal VAV_FB by being in connection with the feedback loop 332. The feedback loop is also connected with the source of the transistor P_GM 316 at node AV. The feedback loop 332 is configured to sense the source voltage at node AV and send it to the positive input of the amplifier A2 330. By being connected to the positive input, the feedback loop 332 forms a negative feedback.

In the resonant element driver circuit 300, node AV may be connected to a capacitor having a large capacitance that prevents oscillation at the node AV. However, the capacitor may cause instability in the feedback loop 332. To minimize or eliminate any instability problems, it may be desirable to decouple the feedback loop from node AV.

Figure 4:
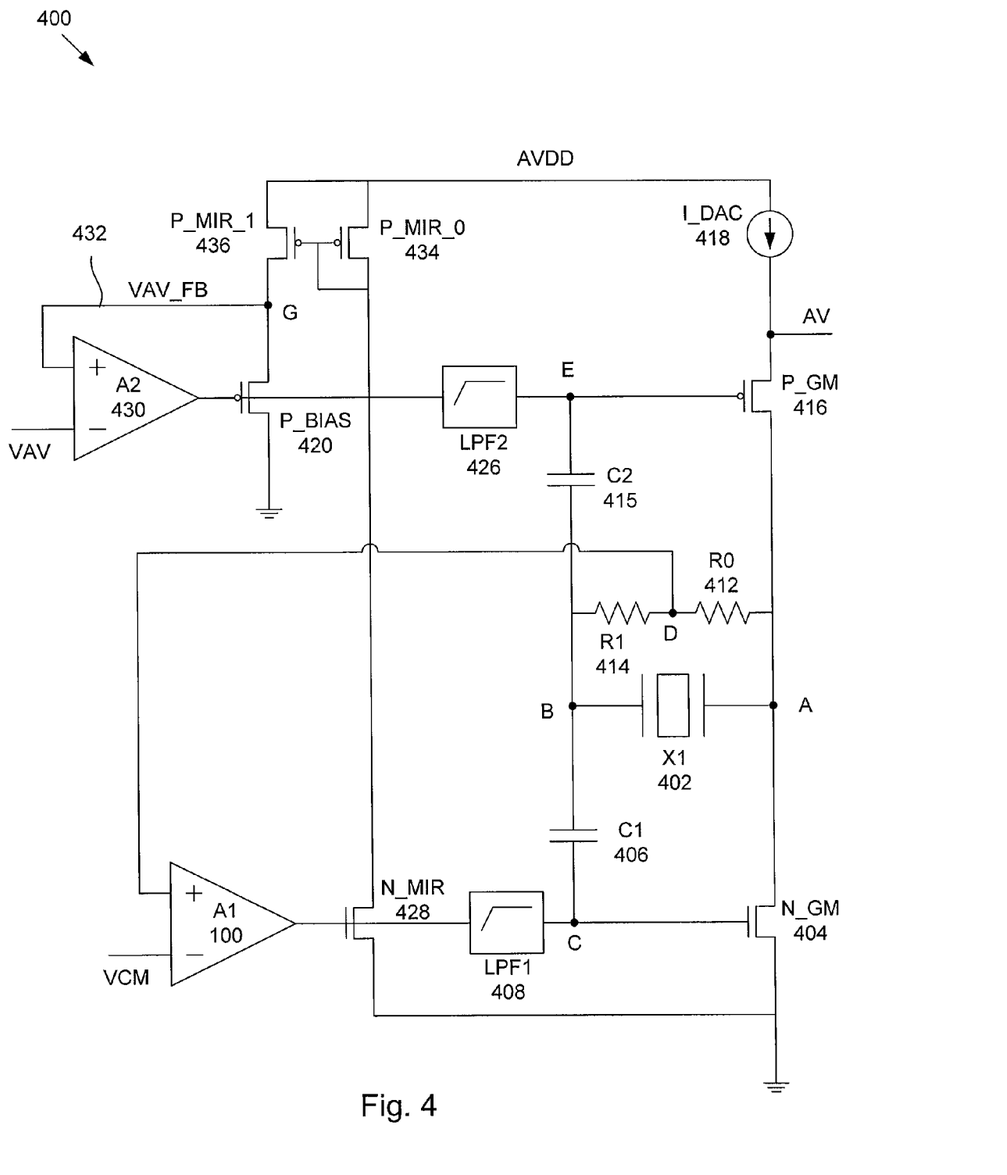
FIG. 4 is a schematic block diagram of a fourth embodiment of a resonator driver.

FIG. 4 shows a third alternative example resonant element driver circuit 400 that is configured to drive a resonant element X1 402. The resonant element driver circuit 400 includes bias circuitry to bias a PMOS transistor P_GM 416 and current mirror circuitry to track variations in the current from the current source I_DAC 418 sent through the PMOS transistor P_GM 416 and the NMOS transistor N_GM 404 to drive the resonant element X1 402. As shown in FIG. 4, the bias circuitry includes a transistor P_BIAS 420. The transistor P_BIAS 420 is a PMOS transistor. In addition, the transistor P_BIAS 420 is the same as or an image of the PMOS transistor P_GM 416. In terms of DC signals, the transistor P_BIAS 420 is configured to conduct the same current as the PMOS transistor P_GM 420 in proportion to their respective sizes. For example, the PMOS transistor P_GM 416 and the transistor P_BIAS 420 have matching current densities. In turn, a gate-to-source voltage of the transistor P_BIAS 420 matches the gate-to-source voltage of the transistor P_GM 416. A gate of the transistor P_BIAS 420 is coupled to a gate of the transistor P_GM 416 via a low pass filter LPF2 426. The bias voltage at the gate of the transistor P_BIAS 420 passes through filter LPF2 426 and is received as the bias voltage at the gate of the transistor P_GM 416 at node E. Because the gate voltages and the gate-to-source voltages of the transistor P_BIAS 420 and the transistor P_GM 416 match, then the voltage at the source of the transistor P_BIAS 420 at node G matches the voltage at the source of the transistor P_GM 416 at node AV.

The bias circuitry further includes an amplifier A2 430 that is configured to provide an output signal to the gate of the transistor P_BIAS 420. The amplifier A2 430 is an op-amp that is configured to receive a reference signal, such as a reference voltage, VAV at a negative input terminal of the amplifier A2 430. The reference signal VAV is a signal that is selectable, adjustable, and/or controllable, and is independent of the voltage source AVDD. The amplifier A2 430 is also configured to receive a signal VAV_FB at a positive input terminal of the amplifier A2 430. The amplifier A2 430 is configured to compare the reference signal VAV with the signal VAV_FB and output an output signal to the gate of the transistor P_BIAS 420. The amplifier A2 430 is configured to receive the signal VAV_FB by being connected with a feedback loop 432. The feedback loop 432 is connected to the positive input of the amplifier A2 430, and is also connected to the source of the transistor P_BIAS 420 at node G. By being connected to node G rather than node AV, the feedback loop 432 is decoupled from the source of the transistor P_GM 416 at node AV. The signal VAV_FB is indicative of the source voltage of the transistor P_BIAS 420. The feedback loop is configured to sense the voltage of the source of the transistor P_BIAS 420 and send the signal VAV_FB to the positive input of the amplifier A2. The amplifier A2 430 compares the signal VAV_FB with the reference signal VAV and output the output signal to the gate of the transistor P_BIAS 420 that compensates for any difference between VAV_FB and VAV determined from the comparison. Because the gate-to-source voltages of the transistor P_BIAS 420 and the transistor P_GM 416 match, then the bias circuitry is configured to so that the source voltage of the transistor P_GM 416 at node AV matches the voltage of the reference signal VAV applied to the negative input of the amplifier A2 430.

The feedback loop 432 forms a master-slave feedback architecture. The master portion of the master-slave architecture includes the feedback loop 432 and the amplifier A2 430. The slave portion of the master-slave architecture includes the transistor P_GM 416. The feedback loop 432 senses the voltage of the source of the transistor P_GM 416 at node G because the voltage at node G is set to match the voltage at node AV, as previously described. The feedback loop 432 sends the sensed voltage at node G via signal VAV_FB into the amplifier A2 430. The amplifier A2 430 compares the signal VAV_FB with the signal VAV and outputs a signal on the gate of the transistor P_BIAS 420, which accounts and/or compensates for any differences between the voltage at the source of the transistor P_GM 416 sensed at node G and the reference signal VAV. The output signal applied to the gate of the transistor P_BIAS 420 sets bias on the gate of the transistor P_GM 416, which in turn sets the source voltage of the transistor P_GM 416 at node AV.

The resonant element driver circuit 400 also includes mirror circuitry that tracks the current flowing through the transistor P_GM 416 and the transistor N_GM 404 from the current source I_DAC, and is also part of the master-slave feedback architecture. The mirror circuitry includes a mirror transistor N_MIR 428, which is similar to the mirror transistor N_MIR 228 of the resonant element driver circuit 200. Current flowing through the transistor P_GM 416 and the transistor N_GM 404 is tracked by the current flowing through the mirror transistor N_MIR 428. The mirror circuitry further includes a transistor P_MIR_0 434 and a transistor P_MIR_1 436. The transistor P_MIR_0 434 and the transistor P_MIR_1 436 are PMOS transistors. Sources of the transistor P_MIR_0 434 and the transistor P_MIR_1 436 are connected to the voltage source AVDD. Also, the gate of the transistor P_MIR_0 434 is connected or tied to the gate of the transistor P_MIR_1 436. The gates of the transistor P_MIR_0 434 and the transistor P_MIR_1 436 are also connected or tied to a drain of the transistor P_MIR_0. The drain of the transistor P_MIR_0 434 is also connected to the mirror transistor N_MIR 428 at the drain of the mirror transistor N_MIR 428. A drain of the transistor P_MIR_1 is connected to the source of the transistor P_BIAS 420 at node G. The current passing through the mirror transistor N_MIR 428 that is tracking the current passing through the transistor P_GM 416 and the transistor N_GM 404 flows through the transistors P_MIR_0 434 and P_MIR_1 436 and the transistor P_BIAS 420. As such, any deviations in current passing through the transistors P_GM 416 and N_GM 404 is tracked by current flowing through the transistor P_BIAS 420. In turn, any deviations in the gate-to-source voltage of the transistor P_GM 416 is tracked by the gate-to-source voltage of the transistor P_BIAS. The mirror circuitry functions as part of the master-slave feedback loop by communicating current deviations and/or gate-to-source deviations back to the transistor P_BIAS 420 so that the source voltage of the transistor P_GM at node AV is precisely sensed at the source of the transistor P_BIAS at node G.

In one example, transistors, or one or more dimensions of the transistors, used to drive the resonant element X1 402, including the transistor N_GM 404 and the transistor P_GM 416, are much larger in size that the transistors that make up the bias circuitry and the mirror circuitry, including the transistor P_BIAS 420, the mirror transistor N_MIR 428, the transistor P_MIR_0 434, and the transistor P_MIR_1 436. For example, the gate widths are much larger. In one example, the gate widths of the transistors N_GM 404 and P_GM 416 may be greater than an order of magnitude, such as about one-hundred times larger than the gate widths of the transistors N_MIR 428, P_BIAS 420, P_MIR_0 434, and P_MIR_1 436. Also, the transistors may be configured to have the same gate lengths so that the transistors are configured to draw the same amount of current in proportion to size, and/or draw the same current density. As a result, the transistors in the bias and mirror circuitry may track the current used to drive the resonant element 402 while only being a fraction or a small percentage (such as one percent) of the driving current. As previously mentioned, current consumption in the resonant element driver circuit 400 may be reduced by adding the PMOS transistor P_GM 416 to the NMOS transistor N_GM 404 because the transconductance used to drive resonant element X1 402 may be doubled (i.e., increased by a factor of two). For example, current consumption may be reduced by 45-50%. Since the current drawn through the mirror and/or bias circuitry may be only a fraction of the current used to drive the resonant element X1 402, then power consumption may be reduced even with adding the mirror and bias circuitry, as compared to when only an NMOS transistor N_GM is used to drive the resonant element X1. For example, total current consumption may be reduced by 40-45%.

The foregoing description of various embodiments of the invention has been presented for purposes of illustration and description. It is not intended to be exhaustive or to limit the invention to the precise embodiments disclosed. Numerous modifications or variations are possible in light of the above teachings. The embodiments discussed were chosen and described to provide the best illustration of the principles of the invention and its practical application to thereby enable one of ordinary skill in the art based on the disclosure and teachings provided herein to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

We claim:

1. A resonant element driver circuit comprising:
a pair of transistors configured to drive a resonant element, the pair of transistors comprising a first transistor and a second transistor;
first biasing circuitry configured to bias the first transistor; and
second biasing circuitry configured to bias the second transistor,
wherein the second biasing circuitry is configured to receive a reference signal independent of a voltage source, the second biasing circuitry configured to use the reference signal in order to bias the second transistor,
wherein the second biasing circuitry comprises:
an amplifier configured to receive the reference signal; and
a feedback loop in communication with the amplifier, the feedback loop being configured to send a feedback signal indicative of a biasing point of the second transistor to the amplifier,
wherein the amplifier is configured to compare the feedback signal with the reference signal and output an output signal that sets the biasing on the second transistor.

2. The resonant element driver circuit of claim 1, wherein the first transistor is a n-channel metal-oxide semiconductor (NMOS) transistor and the second transistor is a p-channel MOS (PMOS) transistor.

3. The resonant element driver circuit of claim 1, wherein the feedback loop is decoupled from the second transistor.

4. The resonant element driver circuit of claim 1, wherein the second biasing circuitry further comprises a third transistor in communication with the output signal of the amplifier and the second transistor;
wherein the amplifier is configured to output the output signal to bias the third transistor.

5. The resonant element driver circuit of claim 4, wherein a gate-to-source voltage of the third transistor is configured to match a gate-to-source voltage of the second transistor.

6. The resonant element driver circuit of claim 4, further comprising mirror circuitry connected to the second biasing circuitry, the mirror circuitry configured to track current flowing in the first and second transistors,
wherein the mirror circuitry comprises:
a fourth transistor connected to the third transistor;
a fifth transistor having a gate connected to a gate of the fourth transistor; and
a sixth transistor connected to the fifth transistor and to the first transistor.

7. The resonant element driver of claim 6, wherein the first transistor and the sixth transistor comprise n-channel metal-oxide semiconductor (NMOS) transistors, and wherein the second transistor, the third transistor, the fourth transistor, and the fifth transistor are p-channel MOS (PMOS) transistors.

8. A method comprising:
biasing, with biasing circuitry, a first transistor of a resonant element driver circuit with a first reference signal;
biasing, with the biasing circuitry, a second transistor of the resonant element driver circuit with a second reference signal, the second reference signal being independent of a voltage source;
driving the resonant element with the first transistor and the second transistor; and
comparing the reference signal with a feedback signal indicative a biasing point of the second transistor,
wherein biasing the second transistor comprises biasing, with the biasing circuitry, the second transistor based on the comparison.

9. The method of claim 8, wherein biasing the first transistor comprises biasing a n-channel metal-oxide semiconductor (NMOS) transistor, and
wherein biasing the second transistor comprises biasing a p-channel MOS (PMOS) transistor.

10. The method of claim 8, further comprising:
tracking current flowing in the first and second transistors with current flowing in the biasing circuitry.

11. The method of claim 8, further comprising:
receiving the feedback signal from a third transistor coupled to the second transistor,
wherein biasing the second transistor comprises:
outputting an output signal to bias the third transistor, the output signal being based on the comparison of the reference signal and the feedback signal.

12. The method of claim 11, further comprising:
adjusting the second reference signal; and
biasing, with the biasing circuitry, the second transistor with the adjusted second reference signal.

13. A resonator comprising:
a resonant element; and
a resonant element driver circuit coupled to the resonant element, the resonant element driver circuit comprising:
  a pair of transistors configured to drive the resonant element, the pair of transistors comprising a first transistor and a second transistor;
  first biasing circuitry configured to bias the first transistor; and
  second biasing circuitry configured to bias the second transistor,
  wherein the second biasing circuitry is configured to receive a reference signal independent of a voltage source, the second biasing circuitry configured to use the reference signal in order to set the biasing on the second transistor,
wherein the second biasing circuitry comprises:
  an amplifier configured to:
    compare the reference signal with a feedback signal indicative of a biasing point of the second transistor; and
    output an output signal that sets the biasing on the second transistor.

\* \* \* \* \*